(12) United States Patent
Salas et al.

(10) Patent No.: US 10,395,871 B1
(45) Date of Patent: Aug. 27, 2019

(54) ELECTRICAL SWITCHING APPARATUS AND METHOD OF MANUFACTURING SAME

(71) Applicant: EATON INTELLIGENT POWER LIMITED, Dublin (IE)

(72) Inventors: Luis F. Salas, Fayetteville, GA (US); Saivaraprasad Murahari, Peachtree City, GA (US); Erik J. Gouhl, Fayetteville, GA (US); Hongzhi Zhou, Dongguan (CN); Neema Firouzian, Sharpsburg, GA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/949,277

(22) Filed: Apr. 10, 2018

(51) Int. Cl.
| H01H 71/02 | (2006.01) |
| H05K 3/28 | (2006.01) |
| H05K 1/02 | (2006.01) |
| H01H 83/02 | (2006.01) |
| H01R 13/713 | (2006.01) |
| H01H 69/00 | (2006.01) |
| H01R 13/512 | (2006.01) |
| H01R 25/00 | (2006.01) |

(52) U.S. Cl.
CPC ........ *H01H 71/0207* (2013.01); *H01H 69/00* (2013.01); *H01H 83/02* (2013.01); *H01R 13/7135* (2013.01); *H05K 1/0256* (2013.01); *H05K 3/284* (2013.01); *H01R 13/512* (2013.01); *H01R 25/006* (2013.01); *H05K 2203/1327* (2013.01)

(58) Field of Classification Search
CPC .... H01H 71/0207; H01H 69/00; H01H 83/02; H01R 13/7135; H01R 13/512; H01R 25/006; H05K 1/0256; H05K 3/284; H05K 2203/1327
USPC ...................................... 200/302.1
See application file for complete search history.

(56) References Cited

U.S. PATENT DOCUMENTS

2013/0280956 A1* 10/2013 Cheng ..................... H05K 5/02
439/620.15

* cited by examiner

*Primary Examiner* — Anthony R Jimenez
(74) *Attorney, Agent, or Firm* — Eckert Seamans Cherin & Mellott, LLC

(57) ABSTRACT

An electrical switching apparatus includes a housing member, a printed circuit board assembly having a board including a first side and a second side facing away from the first side, and a barrier member coupled to each of the housing member and the first side of the board. The barrier member substantially encapsulates the first side of the board.

18 Claims, 8 Drawing Sheets

ELECTRICAL SWITCHING APPARATUS AND METHOD OF MANUFACTURING SAME

BACKGROUND

Field

The disclosed concept relates generally to electrical switching apparatus such as, for example, circuit interrupters. The disclosed concept also relates to methods of manufacturing electrical switching apparatus.

Background Information

Electrical switching apparatus such as, for example and without limitation, ground fault circuit interrupters (GFCIs), arc fault circuit interrupters, arc fault ground fault circuit interrupters, protect people from electric shock hazards in residential, commercial and industrial settings including homes, offices, hospitals, schools and outdoors. For GFCIs, for example, it is often desirable that they last a long time in operation. It is therefore desirable to provide an improved electrical switching apparatus and method of manufacturing the same.

SUMMARY

These needs and others are met by embodiments of the disclosed concept, which are directed to an improved electrical switching apparatus and method of manufacturing the same.

As one aspect of the disclosed concept, an electrical switching apparatus includes a housing member, a printed circuit board assembly having a board including a first side and a second side facing away from the first side, and a barrier member coupled to each of the housing member and the first side of the board. The barrier member substantially encapsulates the first side of the board.

As another aspect of the disclosed concept, a method of manufacturing an electrical switching apparatus is provided. The electrical switching apparatus includes a housing member and a printed circuit board assembly. The printed circuit board assembly has a board including a first side and a second side facing away from the first side. The method comprises the steps of mixing a viscous barrier material, applying the barrier material to the housing member and the first side of the board, and curing the barrier material in order to couple the barrier material to the housing member and the first side of the board. The barrier material substantially encapsulates the first side of the board.

As another aspect of the disclosed concept, an electrical switching apparatus is provided. The electrical switching apparatus includes a housing member, a printed circuit board assembly comprising a board, a first electrical component extending from the board, and a second electrical component extending from the board, and a barrier member engaging each of the board and the housing member in order to provide a seal between the first electrical component and the second electrical component.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the statement that two or more parts or components "engage" one another shall mean that the parts exert a force against one another either directly or through one or more intermediate parts or components.

Example 1

Figure 1:
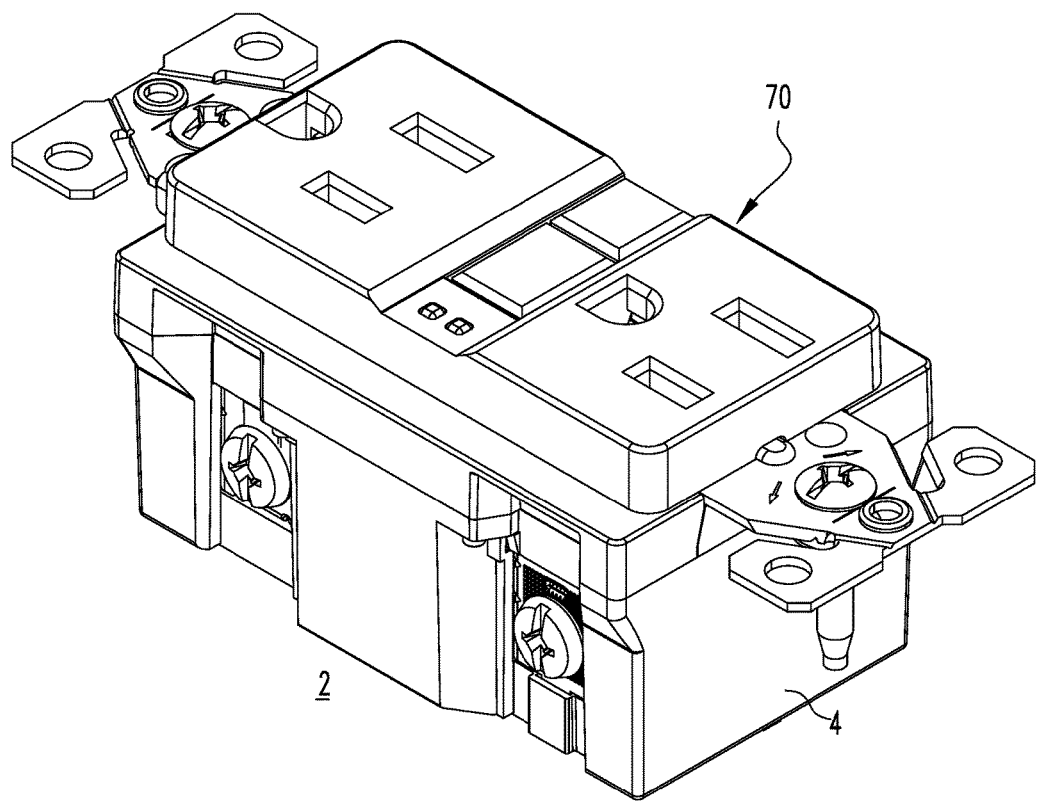
FIG. 1 is an isometric view of an electrical switching apparatus, in accordance with one non-limiting embodiment of the disclosed concept.
Figure 2:
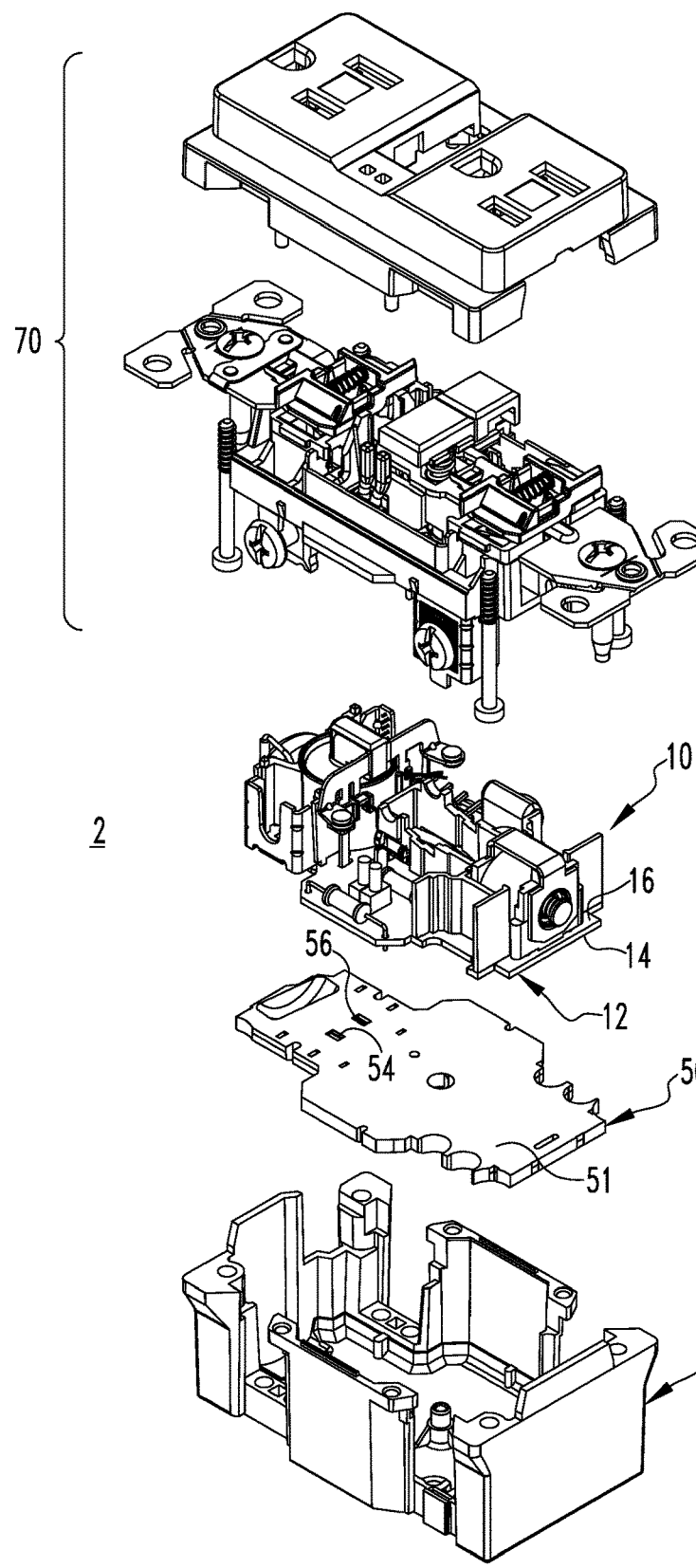
FIG. 2 is an exploded isometric view of the electrical switching apparatus of FIG. 1.

FIGS. 1 and 2 are isometric and exploded isometric views, respectively, of an electrical switching apparatus (e.g., without limitation GFCI 2), in accordance with one non-limiting embodiment of the disclosed concept. As shown in FIG. 2, the GFCI 2 includes, among other components, a housing member 4, a printed circuit board assembly 10, a barrier member 50, and an electrical receptacle assembly 70 coupled to the printed circuit board assembly 10. In one example embodiment, the housing member 4 is a molded member made of an insulating material. As will be discussed below, the barrier member 50 may potentially separate different terminals of the printed circuit board assembly 10 from each other, and also may potentially separate different sides of a board of the printed circuit board assembly 10 from each other.

Figure 3:
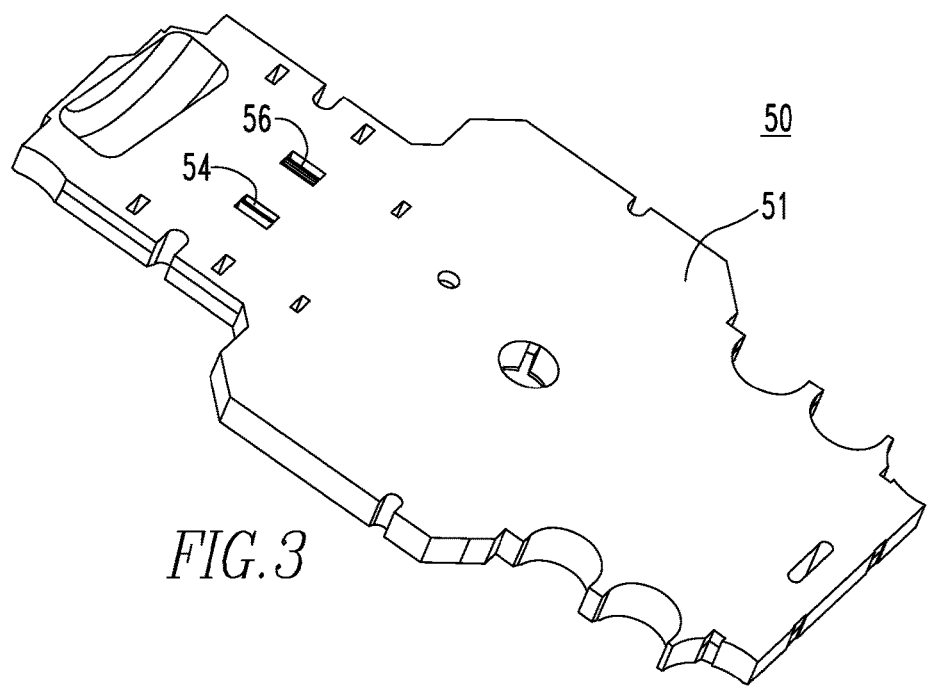
FIGS. 3 and 4 are front isometric and rear isometric views, respectively, of a barrier member for the electrical switching apparatus of FIG. 2.
Figure 4:
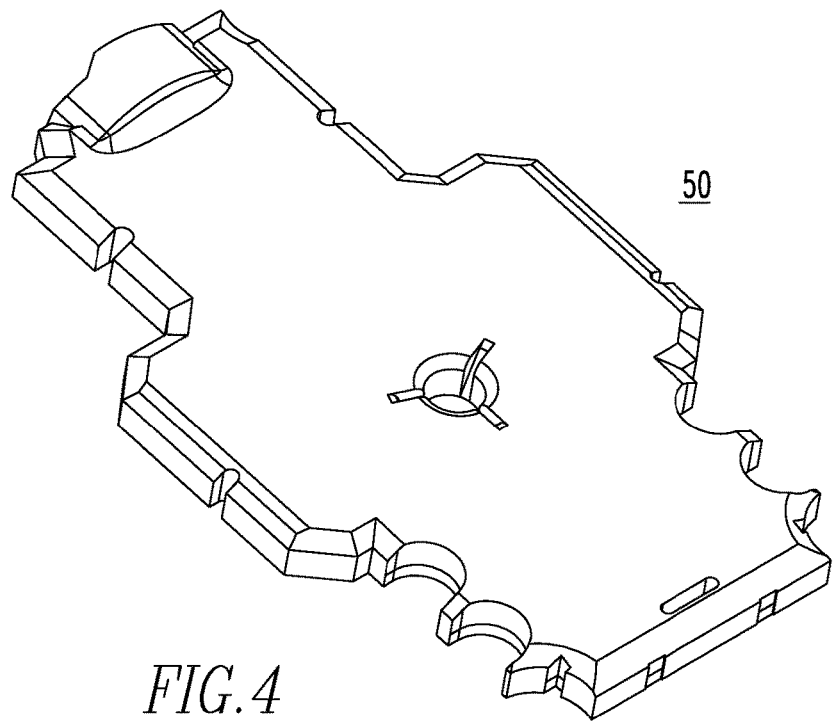

FIGS. 3 and 4 show different isometric views of the barrier member 50. In accordance with the disclosed concept, and as will be discussed below, the barrier member 50 is configured to be adhesively bonded to the housing member 4 and the printed circuit board assembly 10. The barrier member 50 may be made of any suitable insulating material known in the art. One suitable material is a silicone elastomeric material, such as SYLGARD® 160 Silicone Elastomer, manufactured by DOW CORNING® of Midland, Mich., United States of America.

Figure 5:
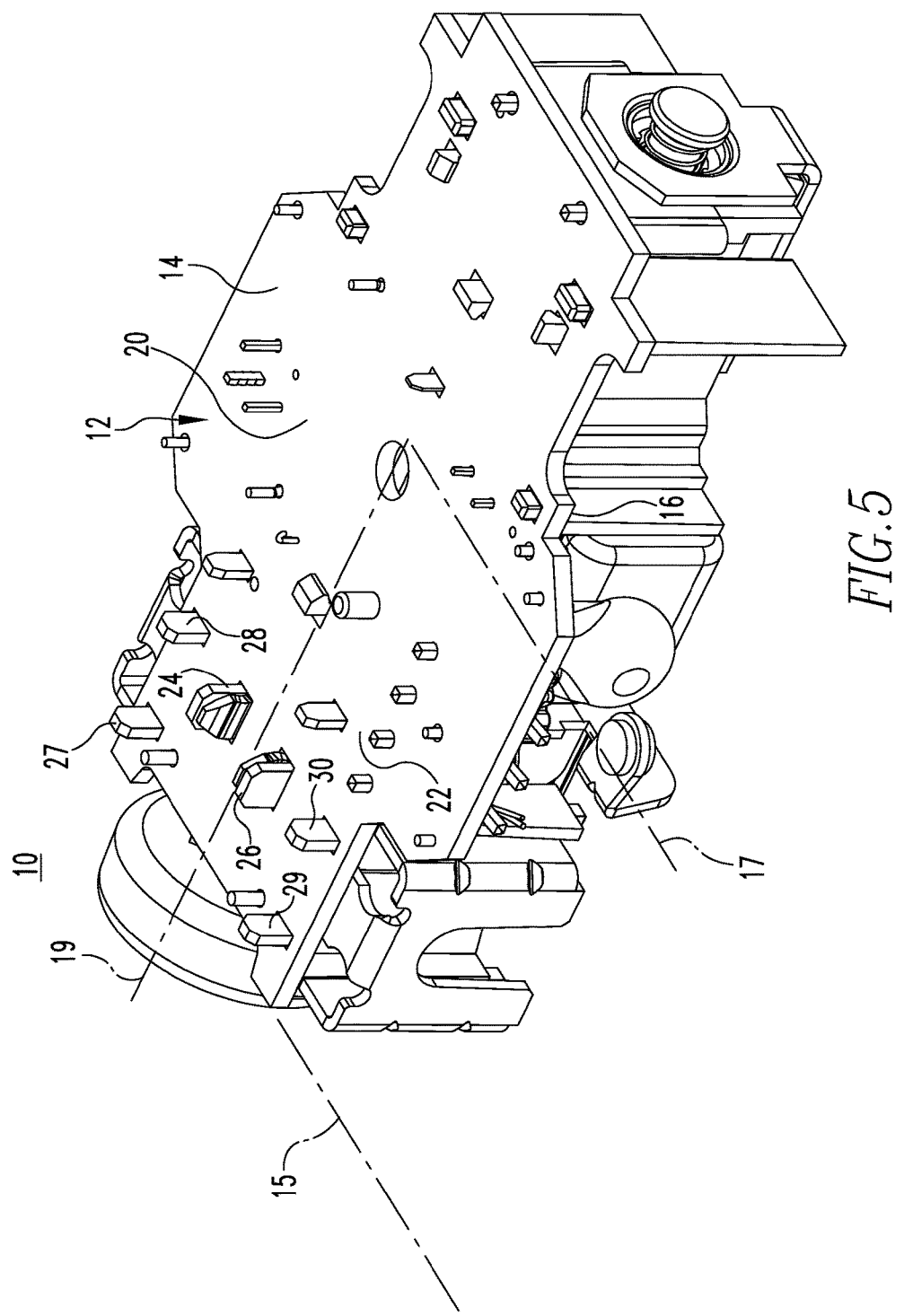
FIG. 5 is a rear isometric view of a printed circuit board assembly for the electrical switching apparatus of FIG. 2.

FIG. 5 shows a rear isometric view of the printed circuit board assembly 10, which includes a generally planar board 12, a hot terminal 24, a neutral terminal 26, and a plurality of other electrical components (e.g., without limitation, four other example electrical components 27,28,29,30 are indicated in FIG. 5). The board 12 has a first side 14 and a second side 16 facing away from the first side 14. It will be appreciated that the first side 14 of the board 12 corresponds to the side on which electrical components are soldered, whereas the second side 16 of the board 12 corresponds to the side on which primary circuit board assembly components (e.g., without limitation, transformer assembly, solenoid assembly, light emitting diodes, resistors, etc.) are disposed. Additionally, the board 12 also has a high voltage region 20 and a low voltage region 22. For example, axes 15,17,19 generally define a boundary for the low voltage region 22 of the board 12, whereas the remaining space of the board 12 (e.g., defined by axes 17,19) generally defines a boundary for the high voltage region 20 of the board 12.

Referring again to FIG. 2, the barrier member 50 is coupled to each of the housing member 4 and the first side 14 of the board 12. Additionally, in accordance with the disclosed concept, the barrier member 50 substantially encapsulates the first side 14 of the board 12. That is, the barrier member 50 at least partially encapsulates (i.e., surrounds, encloses, and/or is configured to minimize the intrusion of fluid therethrough) the first side 14 of the board 12. During assembly of the GFCI 2, the barrier member 50 begins as a molten material that is applied to the housing member 4. When the printed circuit board assembly 10 is placed on top of the molten barrier member 50, and the barrier member 50 cures, an adhesive bond is formed between the barrier member 50 and the housing member 4, and also between the barrier member 50 and the first side 14 of the board 12 (i.e., between the barrier member 50 and the high and low voltage regions 20,22). Additionally, when the barrier member 50 is in its cured state, as shown in FIGS. 3 and 4, the barrier member 50 has a substantially planar portion 51. As shown in FIG. 2, the planar portion 51 engages and is shaped substantially the same as the first side 14 of the board 12.

In accordance with the disclosed concept, the barrier member 50 engages each of the high and low voltage regions 20,22 of the board 12 in order to provide a substantially impermeable liquid barrier between the high and low voltage regions 20,22. Additionally, it will be appreciated that the hot and neutral terminals 24,26, and the other electrical components 27,28,29,30, each extend from the first side 14 of the board 12 toward the housing member 4 and into the barrier member 50 in order to be substantially separated thereby. See, for example, apertures 54,56 in barrier member 50, representing locations into which the hot and neutral terminals 24,26 extend into the barrier member 50. Accordingly, the likelihood that current leakages will occur in the GFCI 2 may be potentially minimized, as compared to prior art GFCIs (not shown). That is, the barrier member 50 substantially encapsulates each of the hot and neutral terminals 24,26. As a result, the barrier member 50 may potentially minimize any electrical pathways between the hot and neutral terminals 24,26. Furthermore, as each of the high and low voltage regions 20,22 of the board 12 are at least partially encapsulated by the barrier member 50, the likelihood that there will be a fluid pathway therebetween may be potentially minimized. As such, the GFCI 2 may last longer in operation than prior art GFCIs (not shown).

It will be appreciated that a method of manufacturing the GFCI 2 includes the steps of mixing a viscous barrier material, applying the barrier material to the housing member 4 and the first side 14 of the board 12, and curing the barrier material in order to couple the barrier material to the housing member 4 and the first side 14 of the board 12, wherein the barrier material substantially encapsulates the first side 14 of the board 12. The method may further include the step of adhesively bonding the barrier material to the housing member 4 and the first side 14 of the board 12. The housing member 4 may have a profile, and the first side 14 of the board 12 may have a profile. Accordingly, the applying step of the method may further include conforming the barrier material to the profile of the housing member 4 and the profile of the first side 14 of the board 12. The method may also further include accelerating curing by locating the housing member 4, the printed circuit board assembly 10, and the barrier material in an oven. The applying step of the method may also further include applying the barrier material to the housing member 4 and the first side 14 of the board 12 such that the barrier material is at a temperature of between 62° F. and 78° F. The applying step may additionally include applying the barrier material to the high voltage region 20 and the low voltage region 22 in order to provide a substantially liquid barrier between the high voltage region 20 and the low voltage region 22.

Example 2

Figure 6:
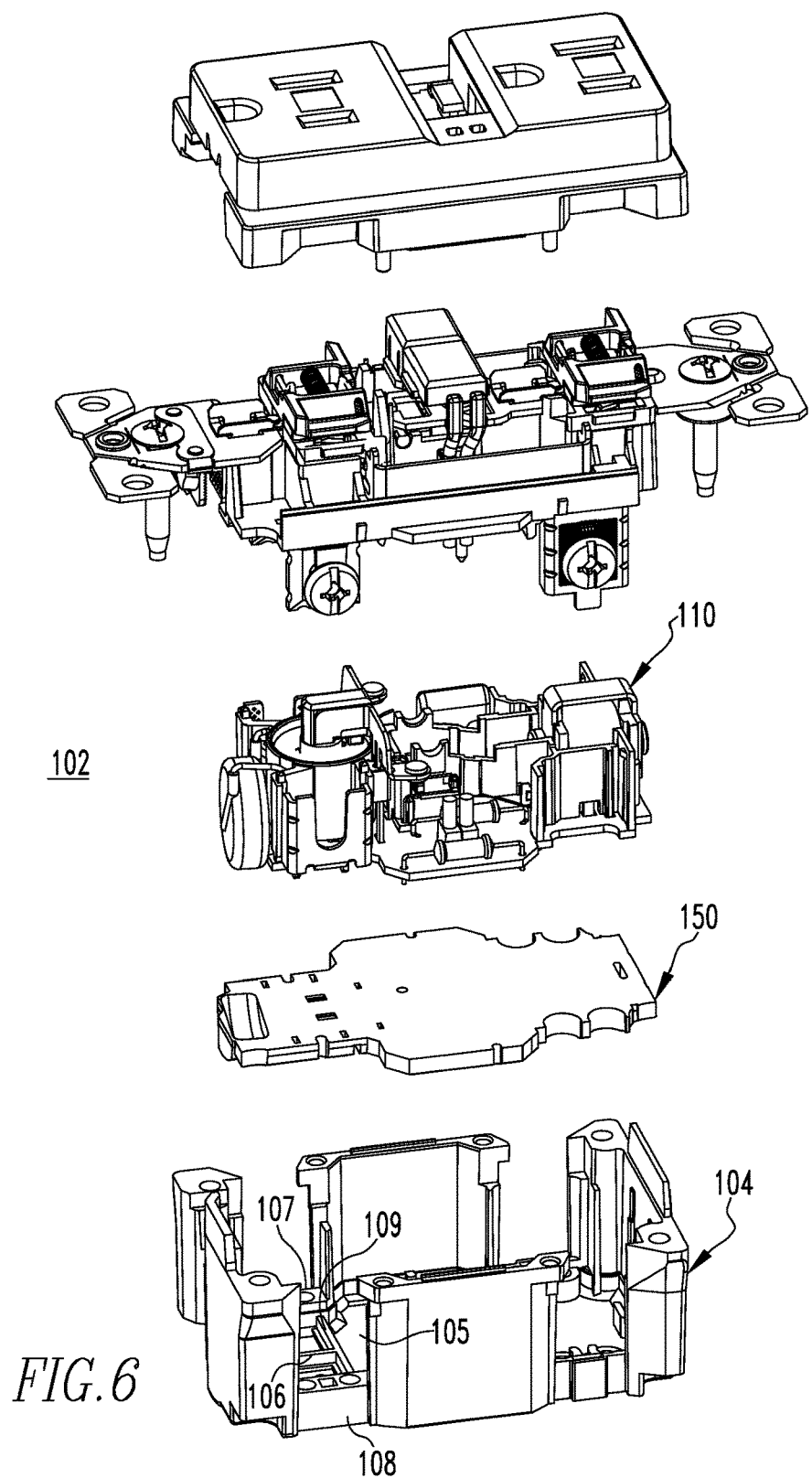
FIG. 6 is an exploded isometric view of another electrical switching apparatus, in accordance with another non-limiting embodiment of the disclosed concept.
Figure 7:
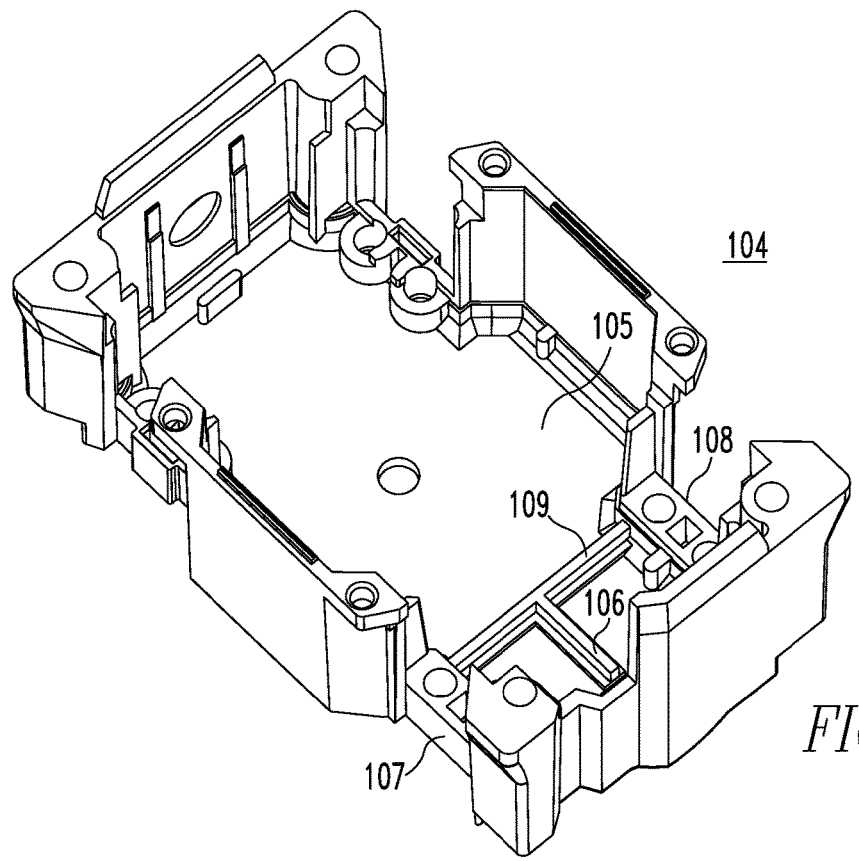
FIG. 7 is an isometric view of a housing member for the electrical switching apparatus of FIG. 6.
Figure 8:
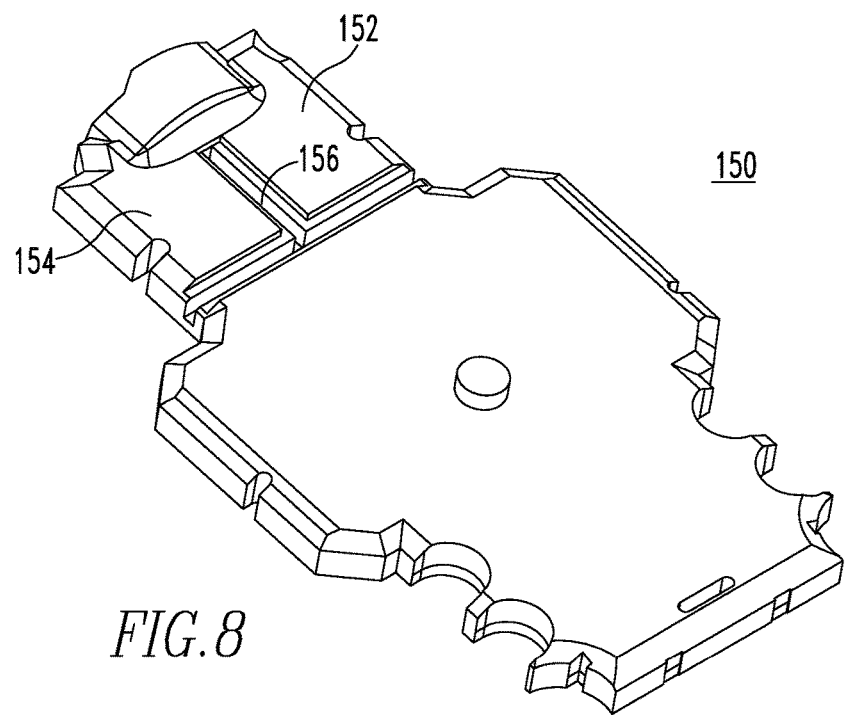
FIG. 8 is a rear isometric view of a barrier member for the electrical switching apparatus of FIG. 6.

FIG. 6 shows an exploded view of another electrical switching apparatus (e.g., without limitation GFCI 102), in accordance with another non-limiting embodiment of the disclosed concept. The GFCI 102 includes similar components as the GFCI 2 (FIGS. 1 and 2), and like reference numbers designate like components. FIG. 7 shows an isometric view of the housing member 104, and FIG. 8 shows a rear isometric view of the barrier member 150. Referring to FIG. 7, the example housing member 104 includes a base portion 105 and a primary wall portion 106 extending from the base portion 105. In one example embodiment, the primary wall portion 106 is located substantially perpendicular to the base portion 105. Furthermore, the base portion 105 has a first side 107 and a second side 108 located opposite and distal the first side 107. As shown, the housing member 104 further includes a secondary wall portion 109 extending from the first side 107 to the second side 108. In one example embodiment, the secondary wall portion 109 intersects and is located substantially perpendicular to the primary wall portion 106.

It will be appreciated that the primary and secondary wall portions 106,109 may potentially provide a further mechanism to isolate components of the printed circuit board assembly 110. Specifically, the primary and secondary wall portions 106,109 form compartments that may potentially isolate the hot and neutral terminals (e.g., not shown in FIG. 6, but see, for example, hot and neutral terminals 24,26 of printed circuit board assembly 10, shown in FIG. 5) of the printed circuit board assembly 110 from each other. In one example embodiment, the primary wall portion 106 is located between the hot and neutral terminals. As such, the potential that there may be a pathway between these terminals may potentially be further reduced, as compared to prior art GFCIs (not shown), by virtue of the potential physical separation provided by the primary and secondary wall portions 106,109.

Furthermore, as the barrier member 150 begins in a viscous form, it follows that a method of manufacturing the GFCI 102 may include substantially the same steps as those discussed above in association with the GFCI 2, and the applying step may further include conforming the barrier material to a profile of the base portion 105 and a profile of the primary wall portion 106. The method may also further include conforming the barrier material to a profile of the secondary wall portion 109.

Accordingly, the barrier member 150 advantageously conforms to the housing member 104. Specifically, as shown in FIG. 8, the barrier member 150 has a first portion 152, a second portion 154, and a grooved portion 156 separating the first portion 152 from the second portion 154. It will be appreciated that the first and second portions 152,154 are each located on opposing sides of the primary wall portion 106 (FIG. 7). Specifically, the primary wall portion 106 extends into the grooved portion 156 of the barrier member 150.

Example 3

Figure 9:
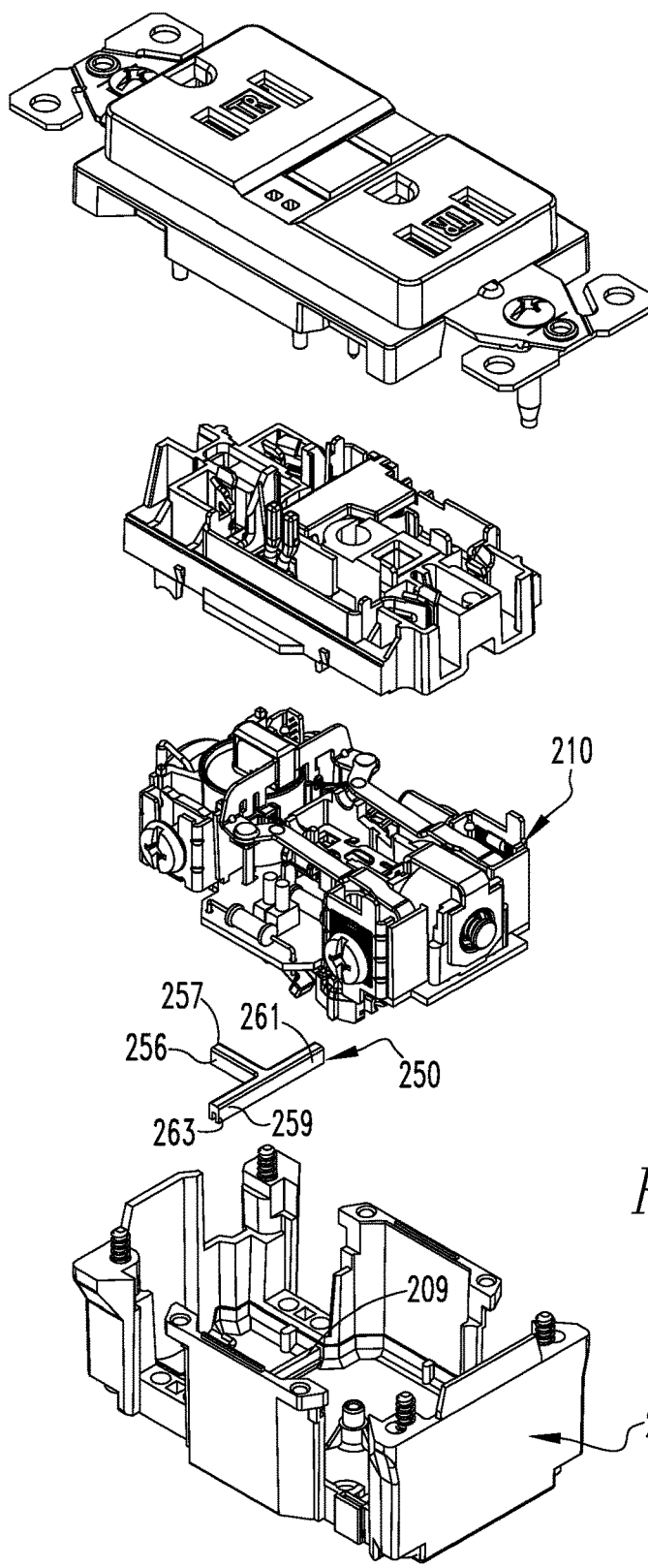
FIG. 9 is an exploded isometric view of another electrical switching apparatus, in accordance with another non-limiting embodiment of the disclosed concept.

FIG. 9 shows an exploded view of another electrical switching apparatus (e.g., without limitation GFCI 202), in accordance with another non-limiting embodiment of the disclosed concept. The GFCI 202 includes similar components as the GFCI 2 (FIGS. 1 and 2), and like reference numbers designate like components. However, in accordance with the disclosed concept, the barrier member for the GFCI 202 is provided as a pre-formed gasket member 250. That is, rather than applying a viscous material to the housing member 204 and the printed circuit board assembly 210, the gasket member 250 may be directly applied to (i.e., engaged with) the housing member 204 without requiring any adhesive bond to be formed therebetween.

Figure 10:
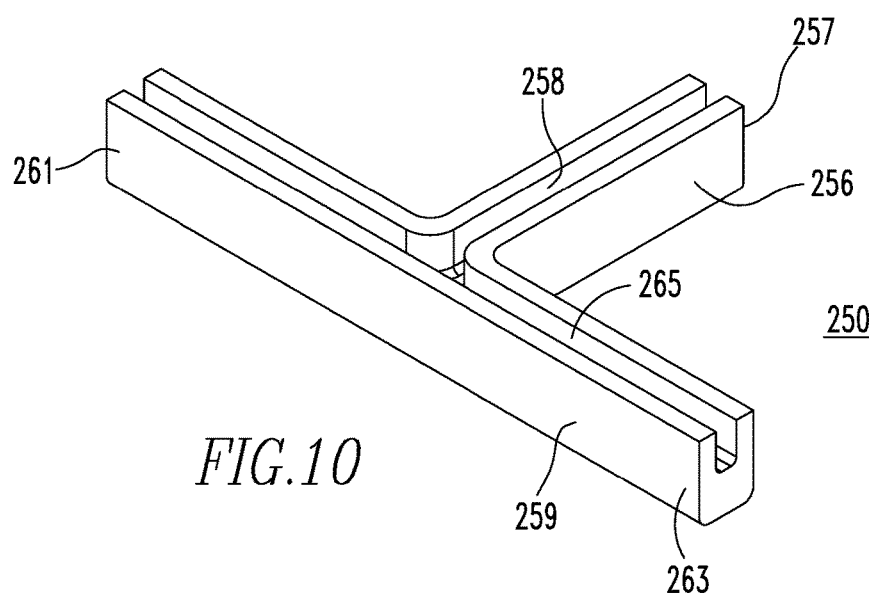
FIG. 10 is a rear isometric view of a barrier member for the electrical switching apparatus of FIG. 9.

Specifically, as shown in FIG. 10, the gasket member 250 is preferably T-shaped, having a primary seal portion 256 and a secondary seal portion 259 located substantially perpendicular to the primary seal portion 256. The primary seal portion 256 has a distal end portion 257 located opposite and distal the secondary seal portion 259, and a grooved region 258 extending from the secondary seal portion to the distal end portion 257. The secondary seal portion 259 has opposing distal end portions 261,263 and a grooved region 265 extending from the first distal end portion 261 to the second distal end portion 263.

Referring again to FIG. 9, when the GFCI 202 is assembled, the gasket member 250 sealingly engages the primary and secondary wall portions (only the secondary wall portion 209 is visible in FIG. 9, but see primary wall portion 106 of housing member 104, shown in FIG. 7). That is, the primary wall portion of the housing member 204 extends into and sealingly engages with the grooved region 258 of the primary seal portion 256, while the secondary wall portion 209 extends into and sealingly engages with the grooved region 265 of the secondary seal portion 259. Furthermore, when printed circuit board assembly 210 is assembled onto the GFCI 202, the gasket member 250 also sealingly engages against it (i.e., sealingly engages against the board of the printed circuit board assembly 210). As such, the primary and secondary seal portions 256,259 are advantageously structured to function in a similar manner as the barrier members 50,150, discussed above. Specifically, as the hot and neutral terminals (not shown in FIG. 9, but see, for example, hot and neutral terminals 24,26 of printed circuit board assembly 10, shown in FIG. 5) are located on opposing sides of the primary seal portion 256, it can be appreciated that the sealing engagement of the gasket member 250 with the printed circuit board assembly 210 and the primary and secondary wall portions 209 may function to remove a pathway the terminals.

It will be appreciated that the disclosed concept provides for an improved electrical switching apparatus 2,102,202 and method of manufacturing the same, in which a barrier member 50,150,250 engages a first side 14 of a board 12 of a printed circuit board assembly 10,110,210 and a housing member 4,104,204. The structural modifications to the electrical switching apparatus 2,102,202 may allow the electrical switching apparatus 2,102,202 to last longer in operation than prior art electrical switching apparatus (not shown). While the disclosed concept has been described thus far in association with the electrical switching apparatus 2,102, 202 being GFCIs, it will be appreciated that suitable alternative electrical switching apparatus (e.g., without limitation, arc fault circuit interrupters, arc fault ground fault circuit interrupters) may be manufactured substantially the same as the GFCIs 2,102,202. That is, arc fault circuit interrupters and arc fault ground fault circuit interrupters in accordance with the disclosed concept may include barrier members and be improved in substantially the same manner as the GFCIs 2,102,202.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electrical switching apparatus comprising:
   a housing member;
   a printed circuit board assembly comprising a board having a first side and a second side facing away from the first side; and
   a barrier member coupled to each of said housing member and the first side of said board, said barrier member substantially encapsulating the first side of said board, wherein said printed circuit board assembly further comprises a hot terminal and a neutral terminal each extending from the first side of said board toward said housing member; wherein said housing member comprises a base portion and a primary wall portion extending from said base portion; and wherein said primary wall portion is disposed between said hot terminal and said neutral terminal.

2. The electrical switching apparatus of claim 1 wherein said barrier member is made of a silicone elastomeric material.

3. The electrical switching apparatus of claim 1 wherein said primary wall portion is disposed perpendicular to said base portion.

4. The electrical switching apparatus of claim 1 wherein said base portion has a first side and a second side disposed opposite and distal the first side of said base portion; wherein said housing member further comprises a secondary wall portion extending from the first side of said base portion to the second side of said base portion; and wherein the secondary wall portion intersects and is disposed substantially perpendicular to the primary wall portion.

5. The electrical switching apparatus of claim 1 wherein said barrier member has a first portion, a second portion, and a grooved portion substantially separating said first portion from said second portion; and wherein said first portion and said second portion are each disposed on opposing sides of said primary wall portion.

6. The electrical switching apparatus of claim 1 wherein said board further has a high voltage region and a low voltage region; and wherein said barrier member is adhesively bonded to said housing member, said high voltage region, and said low voltage region.

7. The electrical switching apparatus of claim 1 wherein said printed circuit board assembly further comprises a plurality of electrical components extending from the first side of said board; and wherein said plurality of electrical components extend into said barrier member.

8. The electrical switching apparatus of claim 7 wherein said barrier member has a substantially planar portion engaging and being shaped substantially the same as the first side of said board.

9. The electrical switching apparatus of claim 1 wherein said board further has a high voltage region and a low voltage region; and wherein said barrier member engages each of said high voltage region and said low voltage region in order to provide a substantially impermeable liquid barrier between said high voltage region and said low voltage region.

10. The electrical switching apparatus of claim 9 wherein said printed circuit board assembly further comprises a hot terminal and a neutral terminal each extending from the first side of said board toward said housing member; and wherein each of said hot terminal and said neutral terminal extend into said barrier member in order to be substantially separated thereby.

11. The electrical switching apparatus of claim 10 wherein said electrical switching apparatus is a ground fault circuit interrupter.

12. An electrical switching apparatus comprising:
a housing member;
a printed circuit board assembly comprising a board, a first electrical component extending from said board, and a second electrical component extending from said board; and
a barrier member engaging each of said board and said housing member in order to provide a seal between said first electrical component and said second electrical component,
wherein said first electrical component is a hot terminal; wherein said second electrical component is a neutral terminal; wherein said housing member comprises a base portion, a primary wall portion extending from said base portion, and a secondary wall portion extending from said base portion; wherein said barrier member is a gasket member sealingly engaged with said primary wall portion and said secondary wall portion.

13. The electrical switching apparatus of claim 12 wherein said primary wall portion extends from and is disposed substantially perpendicular to said secondary wall portion; and wherein said gasket member is substantially T-shaped.

14. A method of manufacturing an electrical switching apparatus, said electrical switching apparatus comprising a housing member and a printed circuit board assembly, said printed circuit board assembly comprising a board having a first side and a second side facing away from the first side, the method comprising the steps of:
mixing a viscous barrier material;
applying said barrier material to said housing member and the first side of said board; and
curing said barrier material in order to couple said barrier material to said housing member and the first side of said board, said barrier material substantially encapsulating the first side of said board,
wherein said printed circuit board assembly further comprises a hot terminal and a neutral terminal each extending from the first side of said board toward said housing member; wherein said housing member comprises a base portion and a primary wall portion extending from said base portion; and wherein said primary wall portion is disposed between said hot terminal and said neutral terminal.

15. The method of claim 14 wherein said board further has a high voltage region and a low voltage region; and wherein the applying step further comprises:
applying said barrier material to said high voltage region and said low voltage region in order to provide a substantially liquid barrier between said high voltage region and said low voltage region.

16. The method of claim 14 further comprising the step of:
adhesively bonding said barrier material to said housing member and the first side of said board.

17. The method of claim 16 wherein said housing member has a profile; wherein the first side of said board has a profile; and wherein the applying step further comprises:
conforming said barrier material to the profile of said housing member and the profile of the first side of said board.

18. The method of claim 17 wherein the method further comprises:
accelerating curing by disposing said housing member, said printed circuit board assembly, and said barrier material in an oven.

* * * * *